United States Patent [19]
Kline

[11] Patent Number: 5,899,755
[45] Date of Patent: May 4, 1999

[54] INTEGRATED CIRCUIT TEST SOCKET WITH ENHANCED NOISE IMMINITY

[75] Inventor: Eric V. Kline, Stillwater, Minn.

[73] Assignee: JohnsTech International Corporation, Minneapolis, Minn.

[21] Appl. No.: 08/815,699

[22] Filed: Mar. 12, 1997

Related U.S. Application Data

[60] Provisional application No. 60/013,413, Mar. 14, 1996.

[51] Int. Cl.⁶ ..................................................... H01R 9/09
[52] U.S. Cl. ............................................................. 439/66
[58] Field of Search ................................. 439/66, 91, 591

[56] References Cited

U.S. PATENT DOCUMENTS

| | | | |
|---|---|---|---|
| 4,871,316 | 10/1989 | Herrell et al. ..................... | 439/66 OR |
| 5,069,629 | 12/1991 | Johnson ............................. | 439/591 X |
| 5,207,584 | 5/1993 | Johnson ............................. | 439/66 OR |
| 5,230,632 | 7/1993 | Baumberger et al. ............ | 439/66 OR |

*Primary Examiner*—Neil Abrams
*Assistant Examiner*—Daniel Wittels
*Attorney, Agent, or Firm*—Nawrocki, Rooney & Sivertson, P.A.

[57] ABSTRACT

An interconnecting device for electrically interconnecting a number of device terminals to a number of board terminals. The interconnecting device includes a housing which has a number of contact receiving slots wherein each slot receives one of a number of contacts. A shielding layer is provided to enhance noise immunity by shielding each contact against electromagnetic interference (EMI). The shielding layer absorbs stray radiated EMI from each one of the number of contacts and dissipates the absorbed energy as thermal energy.

25 Claims, 7 Drawing Sheets

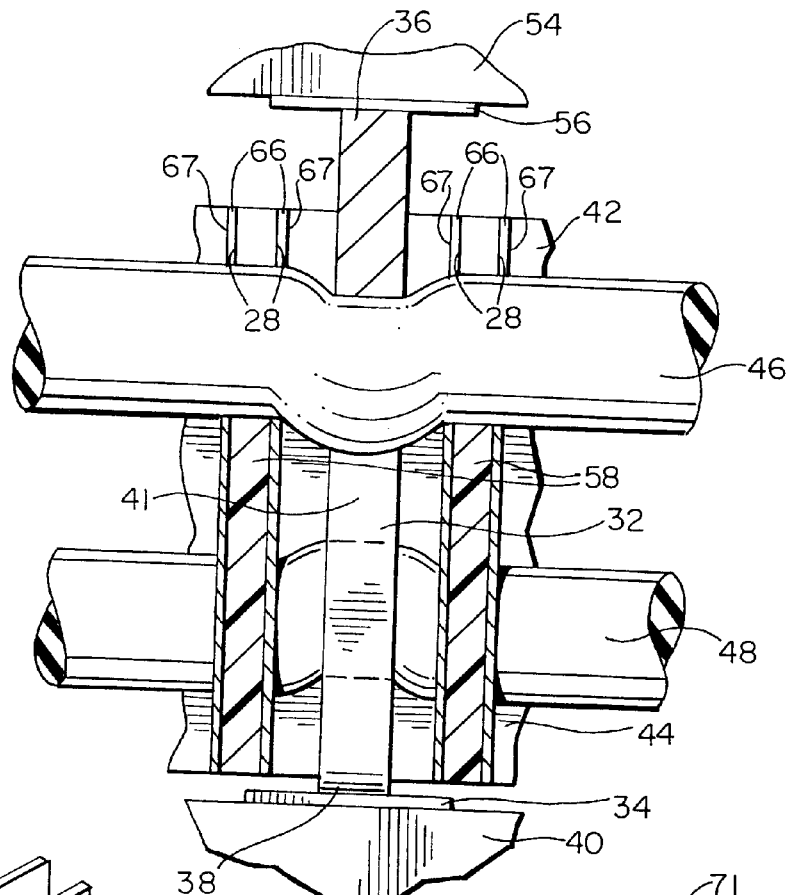
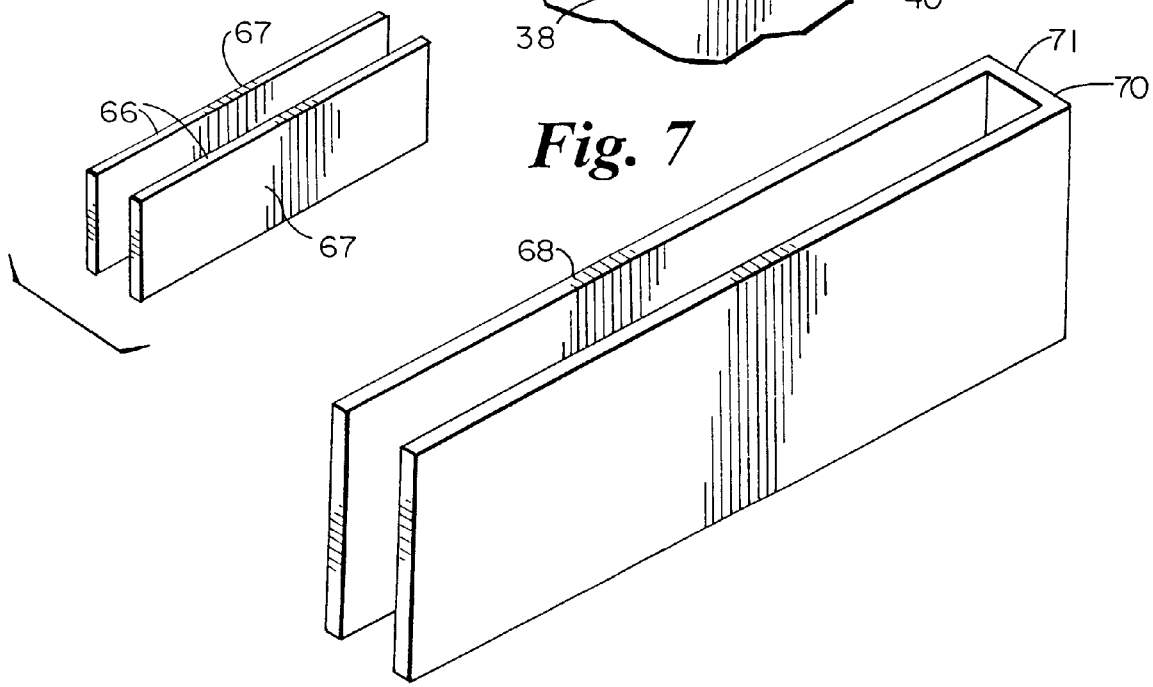

INTEGRATED CIRCUIT TEST SOCKET WITH ENHANCED NOISE IMMINITY

CROSS REFERENCE TO RELATED APPLICATIONS

This is a regular application filed under 35 U.S.C. § 111(a) claiming priority, under 35 U.S.C. § 119(e)(1), of provisional application Ser. No. 60/013,413, previously filed Mar. 14, 1996 under 35 U.S.C. § 111(b).

BACKGROUND OF THE INVENTION

1. Field of the Invention

This invention relates to the field of electrical interconnecting systems. More particularly it relates to an integrated circuit operational or test socket incorporating a shielding layer in the socket to enhance noise immunity by absorbing and dissipating stray radiated electromagnetic energy (EMI).

2. Description of the Prior Art

Electromagnetic Interference (EMI) is a source of noise which can disrupt normal operation of electronic systems. Sources of EMI can include computer systems and electromechanical devices, and may also include signals from cellular phones, television or radio. Sources of EMI can also include cabling, power supplies, and integrated circuit boards. Electronic devices, such as computers, often generate high frequency signals and radiate electrical noise, which can couple to other electronic devices. EMI may leak out of or into interconnecting and multi-pin connectors or integrated circuit sockets used to couple integrated circuit devices to the integrated circuit boards within the electronic devices. As the device switching speed performance and power dissipation requirements for electronic devices used within computer systems continues to increase, the ability of the interconnecting and multi-pin connectors or integrated circuit sockets to provide high noise immunity during operation continues to decrease. The result is that the interconnecting and multi-pin connectors or integrated circuit sockets are not only increasingly susceptible to externally generated EMI, but are increasingly prolific sources of EMI as well.

Many attempts have been made in the prior art to improve EMI performance of computer systems. Shielding has been utilized which consists of extensive and cumbersome metallic elements having conduits for cables. The shielding elements are typically placed in close proximity to and surrounding the socket or the fixture. While this approach is effective, it is also bulky and expensive to implement. This approach, by incorporating the shielding elements, may also add substantial weight to a system. This is a concern for the avionics industry, where the size and weight of systems must be held to a minimum. A disadvantage with this approach however is that it attenuates EMI from external sources, and is wholly ineffective against EMI from internal proximal sources, such as between the terminals of a device.

Another approach for providing an EMI filter is shown in U.S. Pat. No. 5,528,205, issued Jun. 18, 1996, to Wong, which teaches an integrated and drop-in EMI filter which is made out of a ferrite material. The ferrite material has a cutaway space region configured to define a conductor winding portion and a through hole region configured to allow electrical conductors to pass through. Although this approach does filter EMI from externally generated sources, it has the disadvantage of being difficult to assemble and manufacture due to the construction of the winding. This approach may not be easily adapted to be integrated circuit device socket and would not provide proximally located shielding between individual conductor pins with the socket.

Another approach for providing filtering is seen in U.S. Pat. No. 4,761,147, issued Aug. 2, 1988 to Gauthier. Gauthier teaches a ferrite plate placed within the inner space formed by the front and rear shells of a multi-pin connector. This approach also filters EMI from externally generated sources. This approach has the ferrite plate connected to a point of reference potential to dissipate EMI coupled to the pins of the connector, but does not provide proximal shielding between connectors to prevent the EMI from being coupled to the connectors in the first place, and may not be easily adapted to an integrated circuit test socket.

Yet another approach is seen in U.S. Pat. No. 5,360,353, issued Nov. 1, 1994, to Kinoshita. Kinoshita teaches a concave portion being formed on the surface of a connector body, wherein an EMI filter array is fitted to the concave portion to be inserted between and connected to the contact terminals. This approach, however, is not integrated within the socket itself and requires an external element. This approach also does not provide proximal shielding between connectors to prevent EMI from being coupled to the connectors, and would not be easily adapted to an integrated circuit test socket.

SUMMARY OF THE INVENTION

Accordingly, it is an object of the invention to provide an interconnecting device for electrically interconnecting a number of device terminals to a number of board terminals. The interconnecting device includes a housing which has a number of contact receiving slots wherein each slot receives one of a number of contacts. A shielding layer is provided to enhance noise immunity by shielding each contact against electromagnetic interference (EMI). The shielding layer absorbs stray radiated EMI from each one of the number of contacts and dissipates the absorbed energy as thermal energy.

In a preferred embodiment of the present invention, an apparatus is provided to electrically interconnect a number of device terminals to a number of board terminals, where the apparatus comprises a housing, a number of contacts, a shielding means and a dielectric means. In the preferred embodiment, the housing has a top surface and a bottom surface and a number of contact receiving slots extending between the top surface and the bottom surface. Each one of the number of slots extends substantially parallel to a corresponding axis between a corresponding one of the number of device terminals and a corresponding one of the number of board terminals. The corresponding one of the number of device terminals are spaced laterally at a distance from the corresponding one of the number of board terminals. In the preferred embodiment, each one of the number of contacts received within the corresponding one of the number of slots electrically connects the corresponding one of the number of device terminals to the corresponding one of the number of board terminals. Each one of the number of contacts has a top end extending outward from the top surface to conductively engage the corresponding one of the number of device terminals, a bottom end extending outward from the bottom surface to conductively engage the corresponding one of the number of board terminals, and a midregion between the top end and the bottom end.

In the preferred embodiment, a shielding means is provided to absorb EMI generated by the number of contacts or coupled into the number of contacts from external sources. In the preferred embodiment, the shielding means is a shielding layer which has a high permeability and dissipates the absorbed electromagnetic energy as thermal energy within the shielding layer. The shielding layer conforms to an inner surface of each one of the number of slots where the portion of the inner surface is continuous around the midregion of the corresponding one of the number of contacts. In alternate embodiments however the shielding layer may conform to only a portion of the inner surface of each one of the number of slots and may not be continuous around the midregion of the slot.

In the preferred and alternate embodiments the shielding layer is formed of a ferrite or of a high resistivity metal, or is formed of a ferroelectric material or a composite ferroelectric and ferromagnetic compound. In the preferred and alternate embodiments, the shielding layer may be electrically connected to a reference potential such as ground potential if desired to provide a low impedance path to couple the electromagnetic energy or EMI to the ground potential. In the preferred and alternate embodiments, the dielectric means electrically insulates each one of the number of contacts from the shielding means. In the preferred embodiment, the dielectric means is a thin film insulating layer which conforms to an outer surface of the shielding layer wherein the thin film insulating layer electrically insulates each one of the number of contacts from the shielding layer. In the preferred and alternate embodiments, the thin film insulating layer may be comprised of any number of materials well-known in the art.

In one alternate embodiment, the shielding layer may be formed on the entire inner surface of each one of the number of slots and additionally conform to the top surface and the bottom surface of the housing. The thin film insulating layer may be overlying and conforming to an outer surface of the shielding layer within the number of slots.

In another alternate embodiment, the shielding layer may comprise a portion of the inner surface adjacent the top surface and a portion of the inner surface adjacent the bottom surface. The shielding layer forms a first loop having a plane parallel to the top surface, and a second loop having a plane parallel to the bottom surface, wherein the first loop and the second loop are each continuous around the midregion of the slot.

In another alternate embodiment, the dielectric means may be an insulating layer conforming to the midregion of the contact between the top end and the bottom end wherein the shielding layer conforms to the surface of the insulating layer. The insulating layer electrically insulates the midregion of the contact from the shielding layer.

In yet another alternate embodiment, the housing itself may be constructed of any of the materials discussed above which are used to construct the shielding layer. In this alternative embodiment, the housing absorbs the EMI generated by the number of contacts or coupled into the number of contacts from external sources. The housing absorbs the electromagnetic energy and dissipates the absorbed energy as thermal energy. The housing may be connected to a reference potential such as ground potential if desired to provide a low impedance path to couple the electromagnetic energy or EMI to the ground potential. A dielectric layer conforms to the inner surface of each one of the number of slots to electrically insulate each one of the number of contacts from the housing.

BRIEF DESCRIPTION OF THE DRAWINGS

Other objects of the present invention and many of the attendant advantages of the present invention will be readily appreciated as the same becomes better understood by reference to the following detailed description when considered in connection with the accompanying drawings, in which like reference numerals designate like parts throughout the figures thereof and wherein:

FIG. 5 is a fragmentary view showing the contact engaged by a device terminal in a second alternate embodiment of the present invention;

FIG. 6 is a perspective view showing an individual pair of contact shields for the second alternate embodiment;

FIG. 7 is a perspective view showing an individual contact shield for a third alternate embodiment of the present invention;

DETAILED DESCRIPTION OF THE INVENTION

Figure 1:
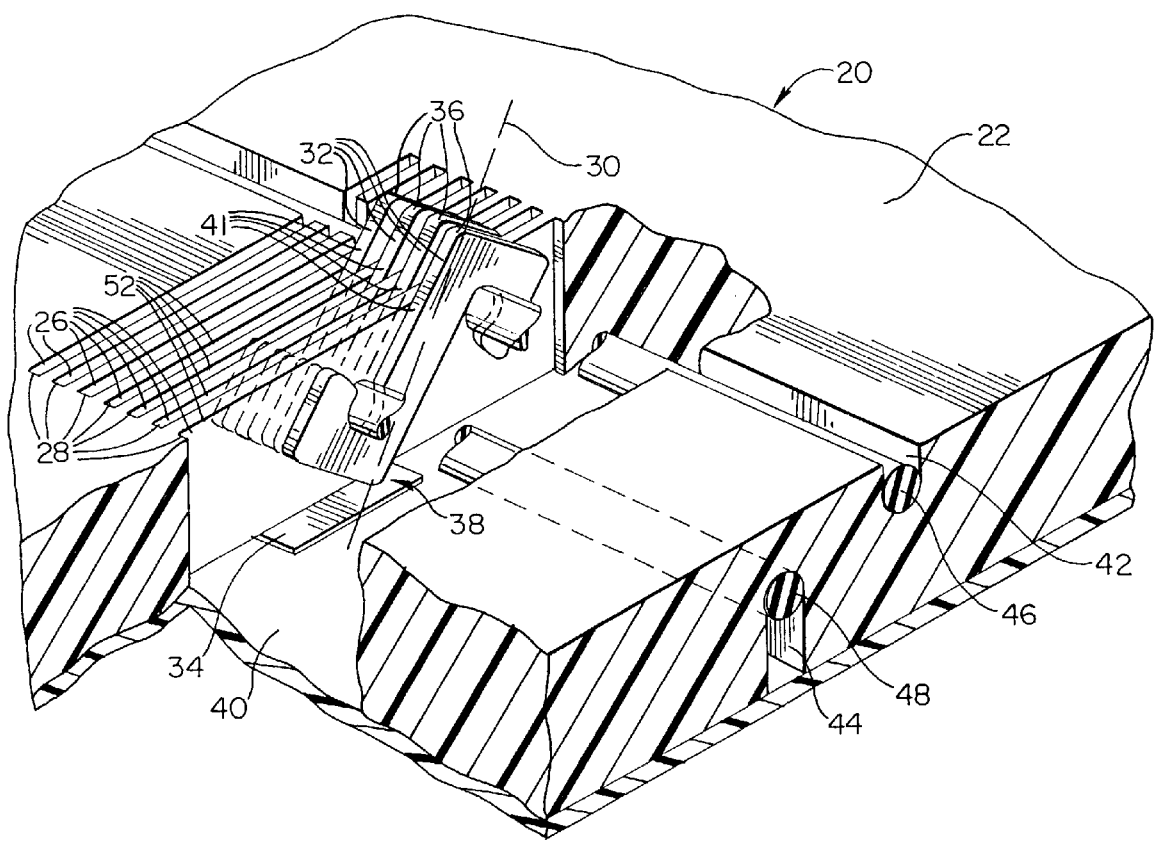
FIG. 1 is an enlarged fragmentary perspective view of a first alternate embodiment of the present invention.

Referring now to the drawings, wherein like reference numerals reference to like elements throughout the several views, FIG. 1 is an enlarged fragmentary perspective view of a first alternate embodiment of the present invention. FIG. 1 illustrates a housing 20 having a top surface 22 and a bottom surface 24. Housing 20 further has a number of contact receiving slots 26 which extend between top surface 22 and bottom surface 24. Some portions of housing 20 are broken away in FIG. 1, but at least seven slots 26 are shown formed through the housing 20. The right-most of the slots 26 is sectioned so that an inner surface 28 is shown. Each one of the number of slots 26 extend substantially parallel to a corresponding axis 30 which extends between a corresponding one of the number of device terminals 56 and a corresponding one of the number of board terminals 34 (see also, FIG. 2). A number of contacts 32 are shown received within a corresponding one of the number of slots 26 to electrically connect each one of the number of device terminals 56 to the corresponding one of the number of board terminals 34. Each one of the number of contacts 30 has a top end 36 extending outward from top surface 22 to conductively engage the corresponding one of the number of device terminals 56. Each one of the number of contacts 32 has a bottom end 38 extending outward from bottom surface 24 to conductively engage the corresponding one of the number of board terminals 34. Each one of the number of contacts 32 further has a midregion 41 defined between top end 36 and bottom end 38. The number of device terminals 56 conductively engaging top end 36 of the number of contacts 32 are spaced laterally at a distance from the number of board terminals 34 in a direction within the plane of either top surface 22 or bottom surface 24. FIG. 1 shows four contacts 32 being disposed in the number of slots 26. It is understood that additional contacts 32 may be disposed in additional slots 26.

Bottom surface 24 of housing 20 is shown being in engagement with a printed circuit board 40 with the number of board terminals 34 traced thereon. Each one of the number of board terminals 34 is intended to be engaged by bottom end 38 of the corresponding number of contacts 32. Since bottom end 38 is biased to extend outwardly beyond bottom surface 24 of housing 20, when printed circuit board 40 is held in position in engagement with bottom surface 24 of housing 20, bottom end 38 of the number of contacts 32 will engage the number of board terminals 34 if the number of board terminals 34 are properly positioned spatially.

FIG. 1 further illustrates a trough 42 formed within housing 20 which extends across and generally traverse to the number of slots 26. In a like manner a trough 44 is also formed within housing 20 to extend across and generally transverse to the number of slots 26. Trough 42 and trough 44 thus are transverse to the direction of orientation of slots 26. In addition, troughs 42 and 44 are laterally offset from one another. Trough 42 is intended to accept a compressible tensily expandable elastomeric element 46 and trough 44 is intended to accept an elastomeric element 48. The construction of the number of contacts 32 in combination with elastomeric elements 46 and 48 within housing 20 are described in U.S. Pat. No. 5,069,629, issued to Johnson on Dec. 3, 1991, which is incorporated herein by reference.

In all of the preferred and alternate embodiments, the material of housing 20 or the shielding layers of the preferred and alternate embodiments may be constructed of high permeability material such as ferrite or a very high resistivity metal to shield against EMI. The material of housing 20 or the shielding layers of the preferred and alternate embodiments may be formed of a ferroelectric material or a composite ferroelectric and ferromagnetic compound. The above material acts as a shielding means to absorb electromagnetic energy generated by the number of contacts 32 or coupled into the number of contacts 32 from external sources when each one of the number of contacts 32 is conductively engaging both the corresponding one of the number of device terminals 56 and the corresponding one of the number of board terminals 34. The material may dissipates the absorbed electromagnetic energy as thermal energy. At the high frequencies of EMI, materials such as ferrite have a resistive impedance component which dominates resulting in attenuation of the EMI through the dissipation of the energy as thermal energy. In the preferred and alternate embodiments of the present invention, this attenuation occurs for EMI generated from any one of the number of contacts 32 or from any source external to housing 20. In FIG. 1 the material of housing 20 is disposed around each one of the number of contacts 32 which are positioned within a corresponding one of the number of slots 26. Thus the material of housing 20 shields each particular one of the number of contacts 32 from the EMI generated either from any other one of the number of contacts 32 or from sources external to housing 20. In the first alternate embodiment, the material of housing 20 absorbs the EMI generated from any one of the number of contacts 32 or an external source and converts the absorbed radiant energy to a thermal energy. The resultant thermal energy does not interfere with the high frequency performance as does the EMI. The thermal energy is dissipated through heat transfer or loss from housing 20. In this first alternate embodiment, the material of housing 20 may be electrically connected to a reference potential such as ground potential to provide a low impedance path to couple the electromagnetic energy or EMI to the ground potential. In the preferred and alternate embodiments of the present invention, at least one of the number of contacts 32 is connected to a reference potential or ground potential. Thus the material of housing 20 may be coupled to the ground potential via the particular contact 32 which is coupled to the ground potential to provide a low impedance path to couple the electromagnetic energy or EMI to the ground potential. As the same materials discussed above for the first alternate embodiment are utilized in the subsequently discussed preferred and alternate embodiments, it is understood that the above discussion is descriptive of all preferred and alternate embodiments of the present invention.

In the first alternate embodiment, housing 20 further includes a dielectric means to electrically insulate each one of the number of contacts 32 from housing 20. The dielectric means is a dielectric layer 52 which conforms to inner surface 28 of each one of the number of slots 26 to electrically insulate each one of the number of contacts 32 within the corresponding one of the number of slots 26 within housing 20. Dielectric layer 52 may be formed of any number of materials known in the art.

Figure 2:
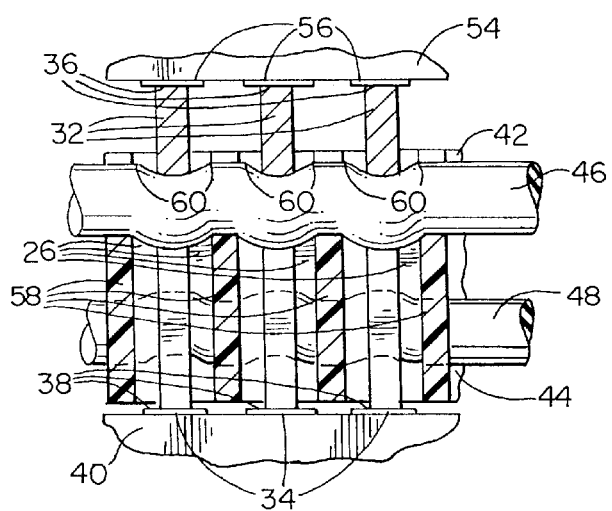
FIG. 2 is a fragmentary view showing the contact engaged by a device terminal.

FIG. 2 is a fragmentary view showing the number of contacts 32 engaged by the number of device terminals 56. FIG. 2 illustrates response of the assembly when each one of the number of device terminals 56 of device 54 are brought into engagement with top end 36 of the corresponding one of the number of contacts 32. FIG. 2 shows elastomeric element 46 received in trough 42 which is formed in top surface 22 of housing 20 is deformed downwardly as it undergoes compression and tensile extension. With the bottom end 38 of the corresponding one of the number of contacts 32 coming into engagement with the corresponding one of the number of terminals 34 of printed circuit board 40, there is a deformation of the elastomeric element 48 received in trough 44 formed in bottom surface 24 of housing 20. Thus as the number of device terminals 56 of device 54 are brought into engagement with top end 36 of the corresponding one of the number of contacts 32 to urge the number of contacts downward at top end 36, the corresponding bottom end 38 of the number of contacts 32 come into engagement with the corresponding one of the number of board terminals 34 of printed circuit board 40.

FIG. 2 shows the number of contacts 32 received in the corresponding one of the number of slots 26 such that each one of the number of contacts 32 is surrounded by a portion of housing 20 shown as number of ribs 58. The housing 20 including the number of ribs 58 absorb electromagnetic energy which is either generated by the number of contacts 32 or coupled into the number of contacts 32 from external sources. The absorbed electromagnetic energy is dissipated as thermal energy. Since in the preferred embodiment the material of housing 20 may be partially conductive, a thin film dielectric layer 60 insulates each one of the number of contacts from the housing where the dielectric layer 60 conforms to an inner surface 28 of each one of the number of slots.

Figure 3:
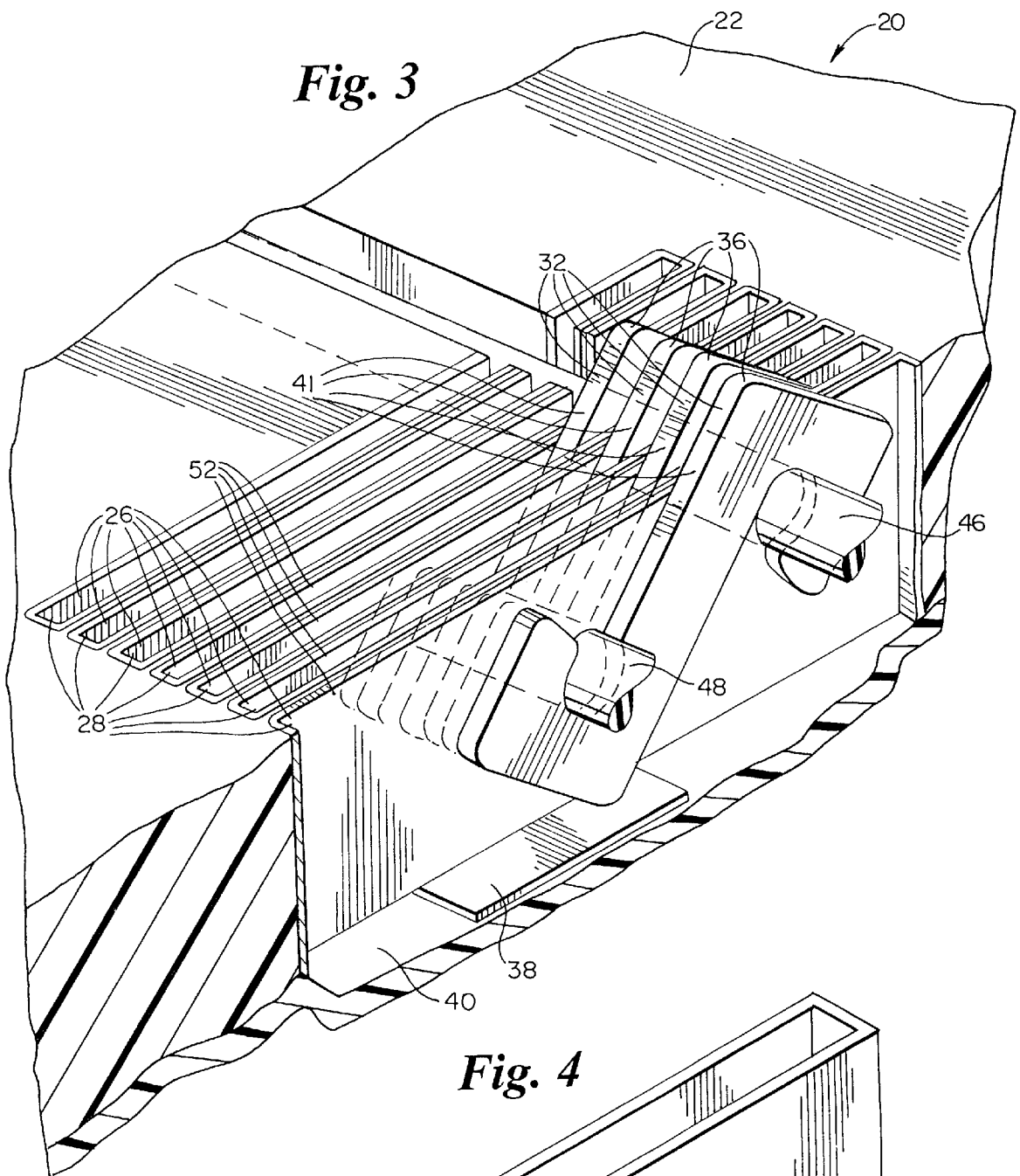
FIG. 3 is a fragmentary perspective view showing a preferred embodiment of the present invention.

FIG. 3 is a fragmentary perspective view showing a preferred embodiment of the present invention. In FIG. 3, the shielding means is a shielding layer 62 which conforms to inner surface 28 of the entire inner surface of each one of the number of slots 26. Shielding layer 62 may be comprised of any of the materials discussed in FIG. 1. Thin film insulating layer 63 is a dielectric to electrically insulate midregion 41 of each one of the number of contacts 32 from the corresponding shielding layer 62 and may be constructed of any number of materials well-known in the art which provide electrically insulative properties. Thin film insulating layer 63 conforms to the outer surface of shielding layer 62 overlying inner surface 28 within each one of the number of slots 26. In the preferred embodiment, each shielding layer 62 may be connected to a reference potential such as a ground potential to provide a low impedance path to couple the electromagnetic energy or EMI to the ground potential. In the preferred embodiment, shielding layer 62 shields each one of the number of contacts 32 from self-generated EMI or EMI generated from any other one of the number of contacts 32 or from any EMI source which is external to housing 20 and which is not one of the number of contacts 32. Shielding layer 62 and absorbs and attenuates the generated radiant energy by conversion into thermal energy before it can be coupled to any one of the number of contacts 32. Although shielding layer 62 in FIG. 3 conforms to the entire area of inner surface 28, it is understood that in other embodiments discussed below, shielding layer 62 may conform to only a portion of inner surface 28 of each one of the number of slots 26. In addition, the portion of inner surface 28 in which the shielding layer 62 conforms may not be continuous on surface 28 around midregion 41 of the corresponding one of the number of contacts 32 as in the preferred embodiment.

Figure 4:
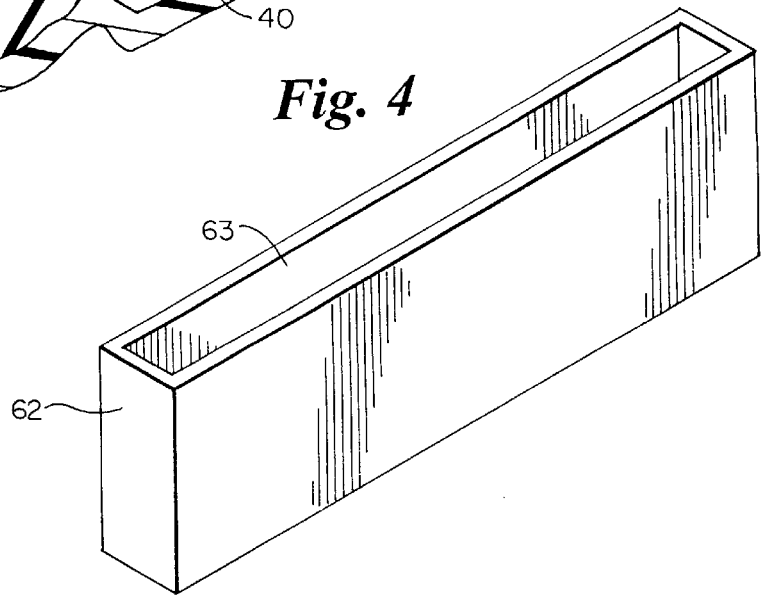
FIG. 4 is a perspective view showing an individual contact shield of the preferred embodiment.

FIG. 4 is a perspective view showing an individual contact shield of the preferred embodiment. In FIG. 4, the shielding layer 62 represents an individual shielding layer which may be received by any one of the number of slots 26. It is understood that the right-most shielding layer 62 within FIG. 3 is shown as a cut-away view and is, in fact, identical to shielding layer 62 as shown in FIG. 4. Shielding layer 62 is continuous about midregion 41 of the corresponding ones of the number of contacts 32 and thus shields each one of the number of contacts 32 from self-generated EMI or EMI generated from any other one of the number of contacts 32 or from any EMI source which is external to housing 20 and not one of the number of contacts 32.

FIG. 5 is a fragmentary view showing the contact engaged by a device terminal in a second alternate embodiment of the present invention. In FIG. 5 the shielding layer is comprised of individual shielding plates 66 which are planar and conform to the portion of inner surface 28 which comprise the number of ribs 58. Shielding plates 66 may be comprised of any of the materials discussed in FIG. 1. Thin film insulating layer 67 is a dielectric to electrically insulate midregion 41 of each one of the number of contacts 32 from the corresponding shielding plates 66 and may be constructed of any number of materials well-known in the art which provide electrically insulative properties. Thin film insulating layer 67 conforms to the outer surface of shielding plates 66 overlying inner surface 28 within each one of the number of slots 26. In the preferred embodiment, each shielding plate 66 may be connected to a reference potential such as a ground potential to provide a low impedance path to couple the electromagnetic energy or EMI to the ground potential. In the preferred embodiment, shielding plates 66 shields each one of the number of contacts 32 from self-generated EMI or EMI generated from any other one of the number of contacts 32 or from any EMI source which is external to housing 20 and which is not one of the number of contacts 32. Shielding plates 66 and absorb and attenuates the generated radiant energy by conversion into thermal energy before it can be coupled to any one of the number of contacts 32.

FIG. 6 is a perspective view showing an individual pair of contact shields for the second alternate embodiment. In FIG. 6, the shielding plates 66 represents an individual pair of shielding layers which may be received by any one of the number of slots 26. FIG. 6 further illustrates that each pair of shielding plates 66 are adjacent midregion 41 of the corresponding ones of the number of contacts 32 and thus shields each one of the number of contacts 32 from self-generated EMI or EMI generated from any other one of the number of contacts 32 or from most EMI sources which are external to housing 20 and which are not one of the number of contacts 32. Although the second alternate embodiment is not continuous about midregion 41 of the corresponding one of the number of contacts 32, this configuration still allows radiant energy to be absorbed from a particular one of the number of contacts 32 to prevent coupling to another particular one of the number of contacts 32.

FIG. 7 is a perspective view showing an individual contact shield for a third alternate embodiment of the present invention. FIG. 7 shows a shielding layer 68 which is similar to shielding plates 66 as shown in FIG. 6 but has the additional end portion 70. In particular configurations it may be necessary to shield the number of contacts 32 from some EMI sources external to the number of contacts 32 and located approximately along an axis perpendicular to an outer surface 71 of end portion 70. Although the third alternate embodiment is not continuous about midregion 41 of the corresponding one of the number of contacts 42, this configuration still allows radiant energy to be absorbed from a particular one of the number of contacts 32 to prevent coupling to another particular one of the number of contacts 32.

Figure 8:
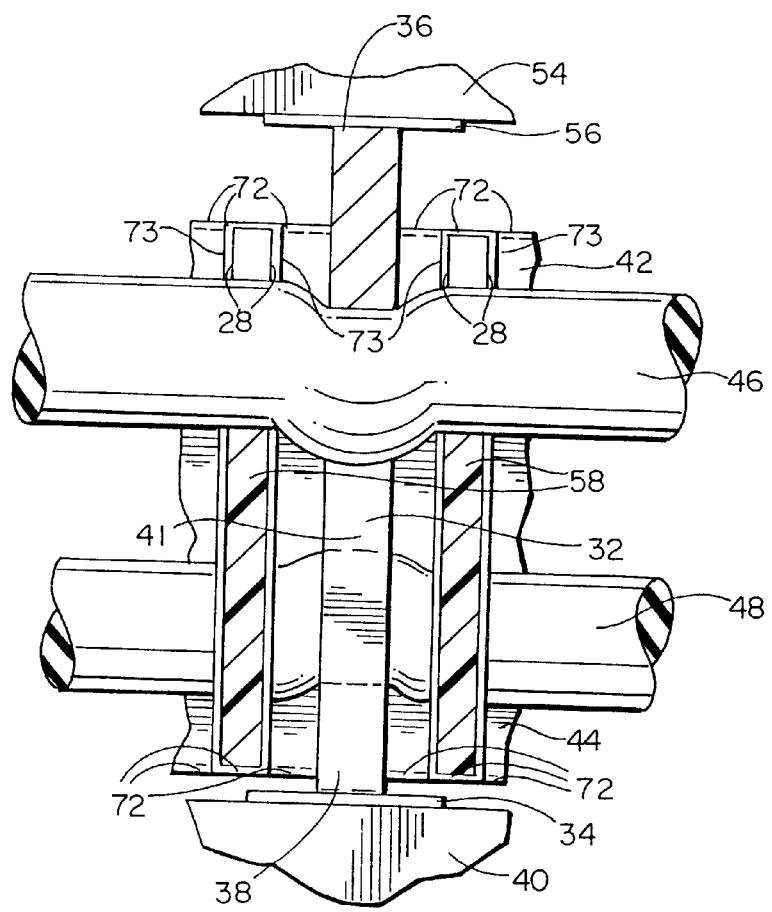
FIG. 8 is a fragmentary view showing the contact engaged by a device terminal in a fourth alternate embodiment of the present invention.

FIG. 8 is a fragmentary view showing the contact engaged by device terminal in a fourth alternate embodiment of the present invention. FIG. 8 shows the shielding layer 72 conforming to the entire inner surface 28 of each one of the number of slots 26 as well as the top surface 22 and bottom surface 24 of housing 20. Shielding layer 72 may be comprised of any of the materials discussed in FIG. 1. Thin film insulating layer 73 is a dielectric to electrically insulate midregion 41 of each one of the number of contacts 32 from the corresponding shielding layer 72 and may be constructed of any number of materials well-known in the art which provide electrically insulative properties. Thin film insulating layer 73 conforms to the outer surface of shielding layer plates 72 overlying inner surface 28 within each one of the number of slots 26. In the preferred embodiment, the shielding layer 72 may be connected to a reference potential such as a ground potential to provide a low impedance path to couple the electromagnetic energy or EMI to the ground potential. In the preferred embodiment, shielding layer 72 shields each one of the number of contacts 32 from self-generated EMI or EMI generated from any other one of the number of contacts 32 or from any EMI source which is external to housing 20 and which is not one of the number of contacts 32. Shielding layer 72 absorbs and attenuates the generated radiant energy by conversion into thermal energy before it can be coupled to any one of the number of contacts 32. This fourth alternate embodiment illustrates that shielding layer 72 may encompass all surfaces of housing 20 to absorb any EMI generated by any one of the number of contacts 32 or from any external EMI source. In some respects this fourth alternate embodiment is similar to the first alternate embodiment shown in FIG. 1 in that the entire outer surface of housing 20 may absorb generated EMI.

Figure 9:
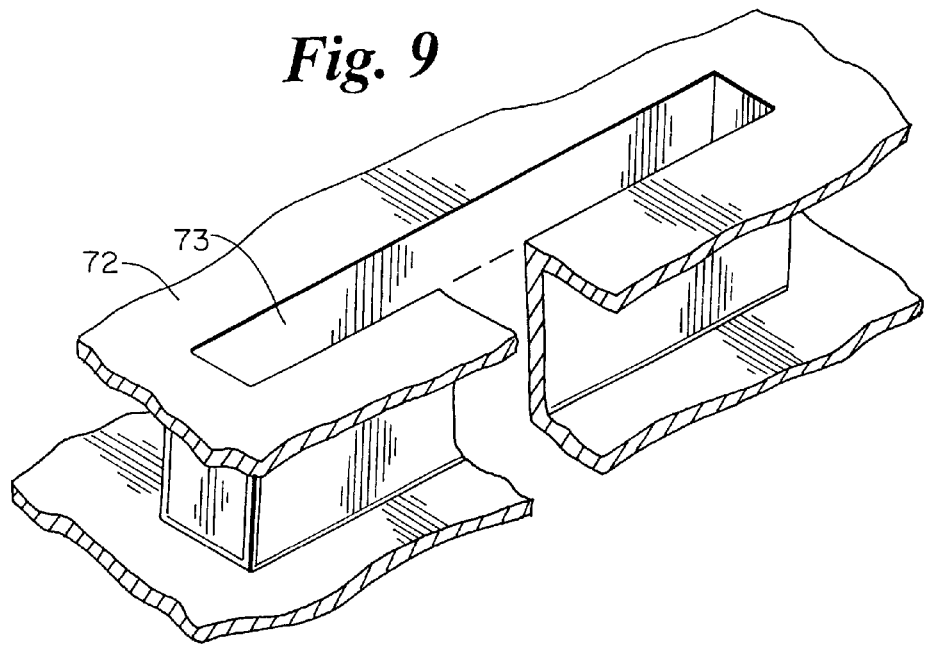
FIG. 9 is a perspective view showing the contact shield for the fourth alternate embodiment.

FIG. 9 is a perspective view showing the contact shield for the fourth alternate embodiment. FIG. 9 shows shielding layer 72 which conforms to the entire portion of inner surface 28 within each one of the number of slots 26 as well as top surface 22 and bottom surface 24 of housing 20. Thus shielding layer 72 shields each one of the number of contacts 32 from self-generated EMI or EMI generated from any other one of the number of contacts 32 or from EMI sources which are external to housing 20 and which are not one of the number of contacts 32.

Figure 10:
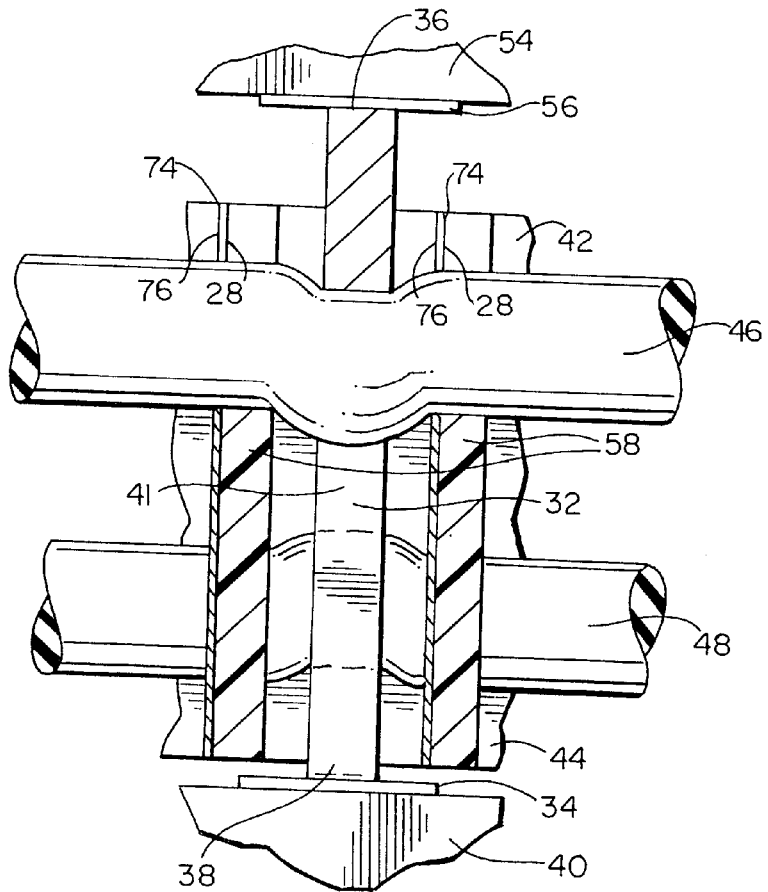
FIG. 10 is a fragmentary view showing the contact engaged by a device terminal in a fifth alternate embodiment of the present invention.

FIG. 10 is a fragmentary view showing the contact engaged by a device terminal in a fifth alternate embodiment of the present invention. FIG. 10 shows shielding layer 74 overlying a portion of inner surface 28 of each one of the number of slots 26 corresponding to approximately half of the area of inner surface 28. Shielding layer 74 may be comprised of any of the materials discussed in FIG. 1. Thin film insulating layer 75 is a dielectric to electrically insulate midregion 41 of each one of the number of contacts 32 from the corresponding shielding layer 74 and may be constructed of any number of materials well-known in the art which provide electrically insulative properties. Thin film insulating layer 75 conforms to the outer surface of shielding layer 74 which overlies inner surface 28 within each one of the number of slots 26. In the preferred embodiment, each shielding layer 74 may be connected to a reference potential such as a ground potential to provide a low impedance path to couple the electromagnetic energy or EMI to the ground potential. In the preferred embodiment, shielding layer 74 shields each one of the number of contacts 32 from self-generated EMI or EMI generated from any other one of the number of contacts 32 or from any EMI source which is external to housing 20 and which is not one of the number of contacts 32. Shielding layer 74 absorbs and attenuates the generated radiant energy by conversion into thermal energy before it can be coupled to any one of the number of contacts 32.

Figure 11:
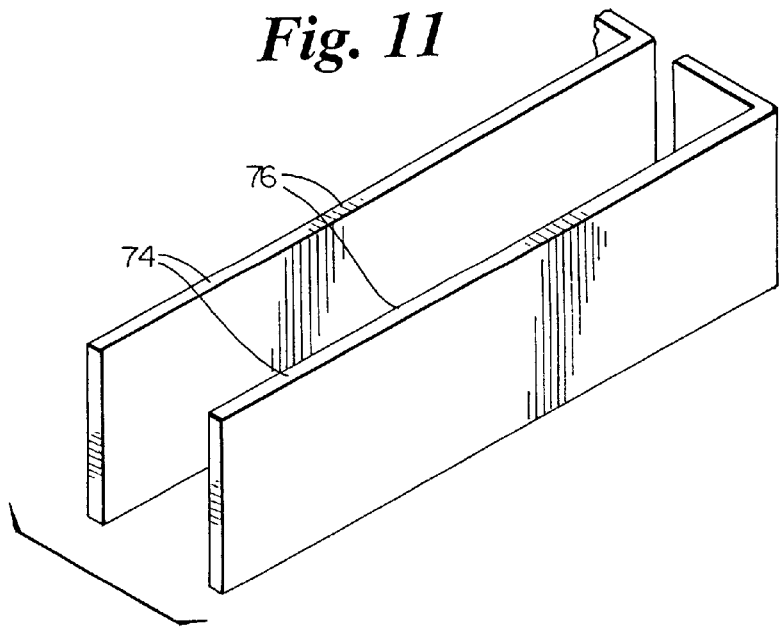
FIG. 11 is a perspective view showing an individual pair of contact shields for the fifth alternate embodiment.

FIG. 11 is a perspective view showing an individual pair of contact shields for the fifth alternate embodiment. FIG. 11 shows that shielding layer 74 being disposed on one side of each of the number of slots 26 for each one of the number of contacts 32 still shields each one of the number of contacts 32 from self-generated EMI or EMI generated from any other one of the number of contacts 32 or from most EMI sources which are external to housing 20 and which are not one of the number of contacts 32.

Figure 12:
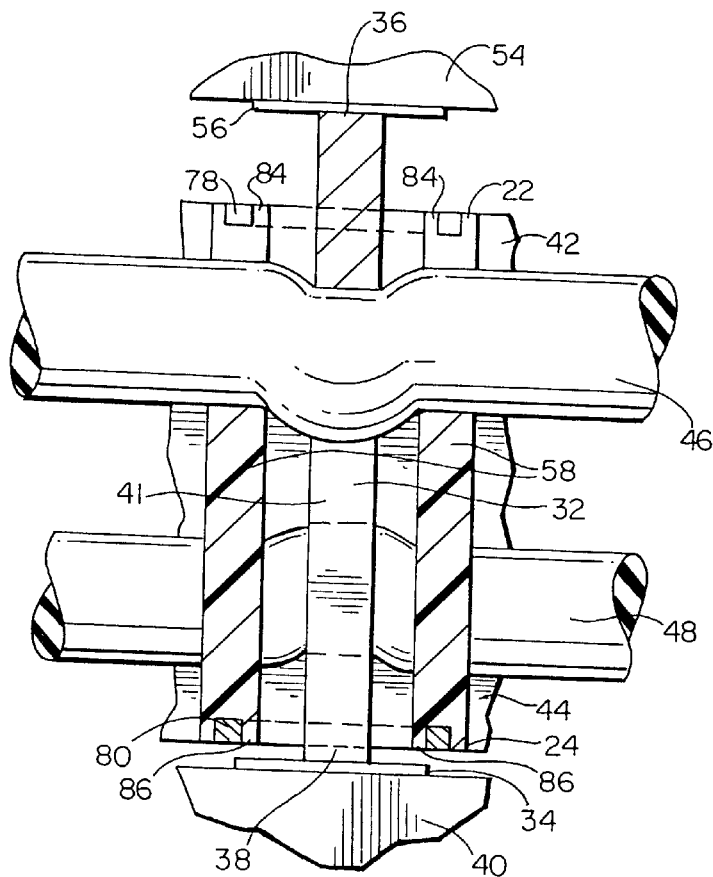
FIG. 12 is a fragmentary view showing the contact engaged by a device terminal in a sixth alternate embodiment of the present invention.
Figure 12A:
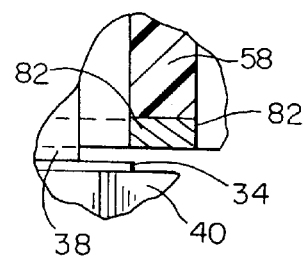
FIG. 12A is a partial fragmentary view showing a variation of the sixth alternate embodiment of the present invention.

FIG. 12 is a fragmentary view showing the contact engaged by a device terminal in a sixth alternate embodiment of the present invention. In FIG. 12 the shielding layer comprises a first shielding ring 78 and a second shielding ring 80. The first shielding ring 78 and second shielding ring 80 each are continuous around midregion 41 of the corresponding one of the number of contacts 32 in a region where midregion 41 joins top end 36 and bottom end 38. First shielding ring 78 and a second shielding ring 80 may be comprised of any of the materials discussed in FIG. 1. In FIG. 12 first shielding ring 78 and second shielding ring 80 are inset within each one of the number of ribs 58. In the partial fragmentary view shown in 12A on a variation of the sixth alternate embodiment of the present invention, first shielding ring 78 and second shielding ring 80 are not inset within the corresponding one of the number of ribs 58, but rather extend the entire width of the corresponding one of the number of ribs 58. First shielding ring 78 and second shielding ring 80 may each be connected to a reference potential such as a ground potential to provide a low impedance path to couple the electromagnetic energy or EMI to the ground potential. It is understood that either embodiment provides a first shielding ring 78 and a second shielding ring 80 which couples self-generated EMI or EMI generated from any other one of the number of contacts 32 or from any EMI source which is external to housing 20 and which is not one of the number of contacts 32. First shielding ring 78 and a second shielding ring 80 each absorb and attenuate the generated radiant energy by conversion into thermal energy before it can be coupled to any one of the number of contacts 32. In FIG. 12A when first shielding ring 78 and second shielding ring 80 have a thickness equal to the corresponding one of the number of ribs 58, a thin film insulating layer 79 is disposed on an inner surface of first shielding ring 78 and a thin film insulating layer 81 is disposed on an inner surface of second shielding ring 80. Thin film insulating layers 79 and 81 are a dielectric to electrically insulate midregion 41 of each one of the number of contacts 32 from the corresponding first shielding ring 78 and second shielding ring 80 and may be constructed of any number of materials well-known in the art which provide electrically insulative properties.

Figure 13:
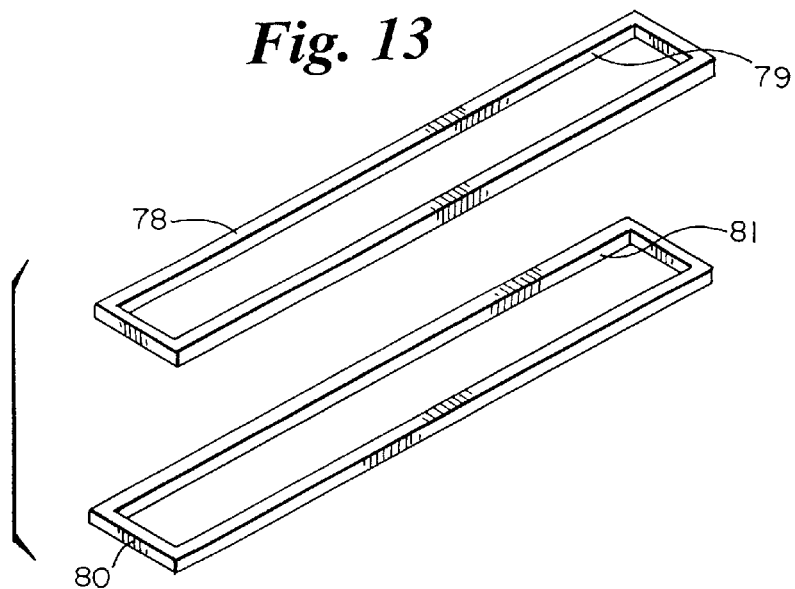
FIG. 13 is a perspective view showing an individual pair of contact shields for the sixth alternate embodiment.

FIG. 13 is a perspective view showing an individual pair of contact shields for the sixth alternate embodiment. FIG. 13 shows first shielding ring 78 and second shielding ring 80. First shielding ring 78 and second shielding ring 80 are each continuous around midregion 41 of the corresponding one of the number of contacts 32 to couple EMI generated from adjacent ones of the number of contacts 32 or from external sources and absorb the radiated energy by conversion to thermal energy. First shielding ring 78 conforms to a top region 84 adjacent inner surface 28 which is adjacent top surface 22 where top region 84 defines a loop having a plane which is parallel to top surface 22. Second shielding ring 80 conforms to a bottom region 86 adjacent inner surface 28 which is adjacent bottom surface 24 where bottom region 86 defines a loop having a plane which is parallel to bottom surface 24.

Figure 14:
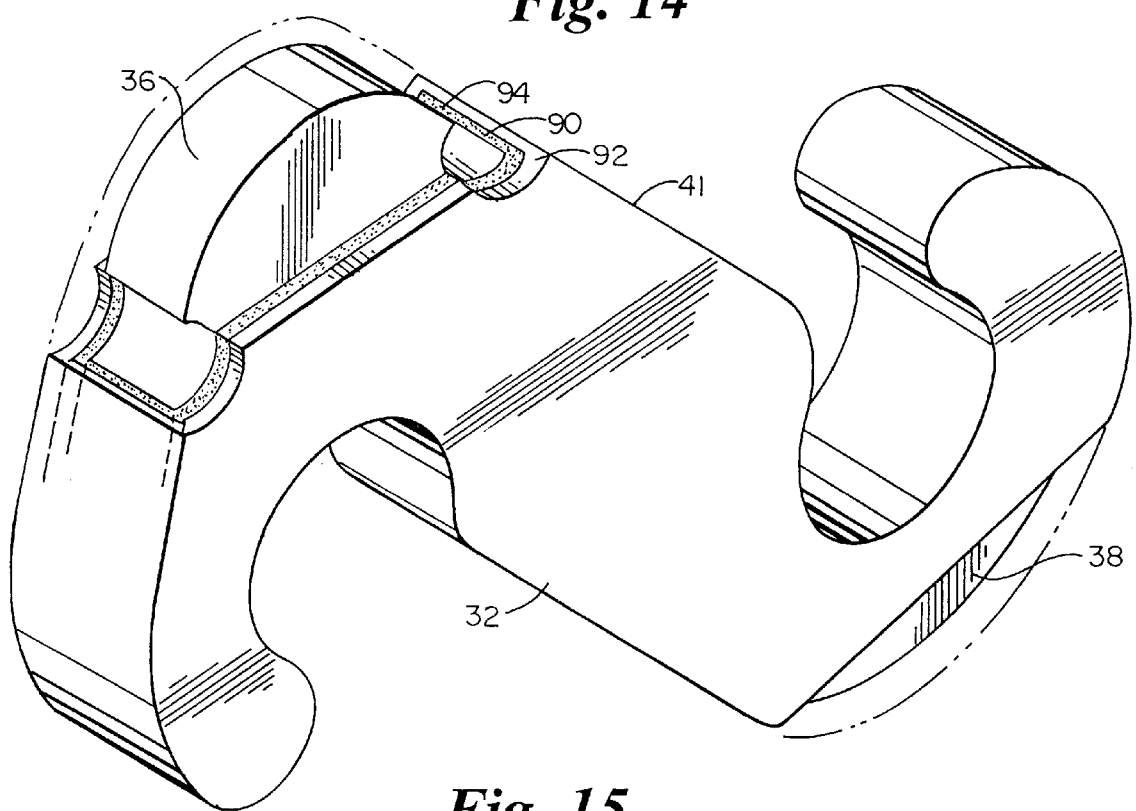
FIG. 14 is a perspective view of an individual contact in a seventh alternate embodiment of the present invention.

FIG. 14 is a perspective view of an individual contact in a seventh alternate embodiment of the invention. FIG. 7 shows a dielectric insulating layer 90 which conforms to the midregion 41 of the corresponding one of the number of contacts 32 between top end 36 and bottom end 38. Dielectric insulating layer 90 is a dielectric to electrically insulate midregion 41 of each one of the number of contacts 32 and may be comprised of any number of materials well-known in the art which provide electrically insulative properties. The shielding means is a shielding layer 92 which conforms to an outer surface 94 of dielectric layer 90 where dielectric layer 90 electrically insulates midregion 41 of the corresponding one of the number of contacts 32 from shielding layer 92. Top end 36 and bottom end 38 are not coated by dielectric layer 90 or shielding layer 92 so that top end 36 may conductively engage the corresponding one of the number of device terminals 56 and bottom end 38 may conductively engage the corresponding one of the number of board terminals 34. Shielding layer 92 may be comprised of any of the materials discussed in FIG. 1. Shielding layer 92 may be connected to a reference potential such as a ground potential to provide a low impedance path to couple the electromagnetic energy or EMI to the ground potential. Shielding layer 92 shields the corresponding one of the number of contacts 32 from self-generated EMI or EMI generated from any other one of the number of contacts 32 or from any EMI source which is external to housing 20. Shielding layer 92 absorbs and attenuates the generated radiant energy by conversion into thermal energy before it can be coupled to any one of the number of contacts 32.

Figure 15:
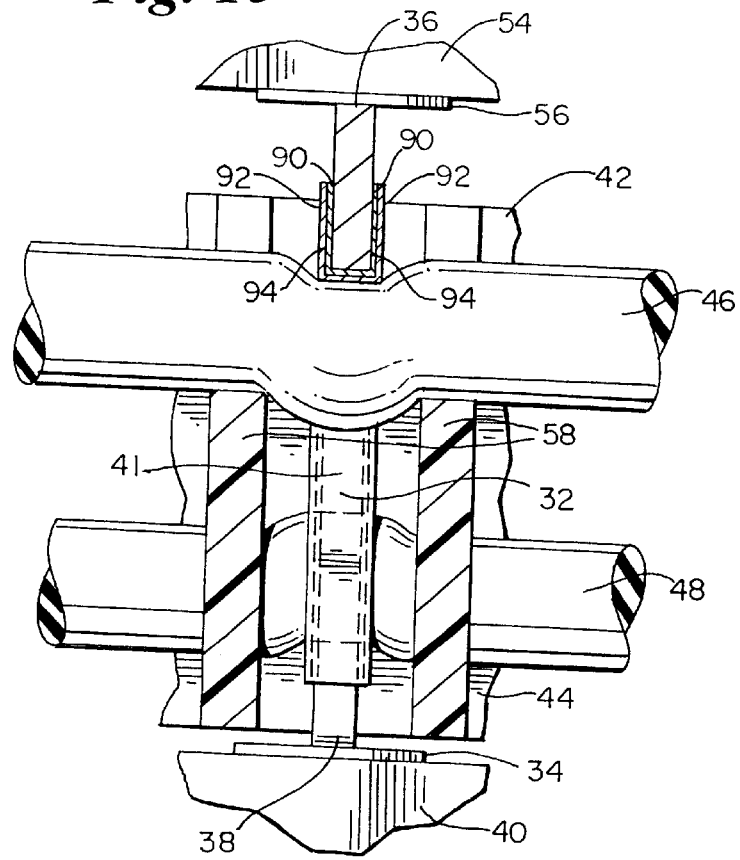
FIG. 15 is a fragmentary view showing the contact engaged by a device terminal in the seventh alternate embodiment of the present invention.

FIG. 15 is a fragmentary view showing the contact engaged by a device terminal in a seventh alternate embodiment of the present invention. FIG. 15 shows one of the number of contacts 32 having dielectric layer 90 and shielding layer 92. FIG. 15 shows shielding layer 92 conforming to dielectric layer 90 which conforms to midregion 41 of the particular one of the number of contacts 32. Shielding layer 92 shields the particular one of the number of contacts 32 from self-generated EMI or EMI generated from any other one of the number of contacts 32 or from any EMI source which is external to housing 20.

It will be understood that this disclosure, in many respects, is only illustrative. Changes may be made in details, particularly in matters of shape, size, material, and arrangement of parts without exceeding the scope of the invention. Accordingly, the scope of the invention is as defined in the language of the appended claims.

What is claimed is:

1. Apparatus for electrically interconnecting a number of device terminals to a number of board terminals, comprising:

a. a housing having a top surface and a bottom surface and a number of contact receiving slots extending between said top surface and said bottom surface, each one of said number of slots extending substantially parallel to a corresponding axis extending between a corresponding one of the number of device terminals and a corresponding one of the number of board terminals, each of said device terminals being spaced at a distance from a corresponding one of the number of board terminals;

b. a number of contacts, each one of said number of contacts received within a corresponding one of said number of slots to electrically connect a corresponding one of the number of device terminals to a corresponding one of the number of board terminals, each of said number of contacts having a top end extending outward from said top surface to conductively engage said corresponding device terminal, a bottom end extending outward from said bottom surface to conductively engage said corresponding board terminal, and a midregion between said top end and said bottom end;

c. shielding means to absorb electromagnetic energy generated by said number of contacts when each of said number of contacts is conductively engaging both its corresponding device terminal and its corresponding board terminal, wherein said shielding means dissipates the absorbed electromagnetic energy as thermal energy; and d. dielectric means to electrically insulate each of said number of contacts from said shielding means.

2. An apparatus according to claim 1 wherein the shielding means is a shielding layer which conforms to at least a portion of an inner surface of each one of the number of slots.

3. An apparatus according to claim 2 wherein the portion of the inner surface is continuous around the midregion of the corresponding one of the number of contacts.

4. An apparatus according to claim 2 wherein the portion of the inner surface is the entire inner surface of the slot within the housing.

5. An apparatus according to claim 4 wherein the shielding layer further conforms to the top surface and the bottom surface of the housing.

6. An apparatus according to claim 2 wherein the portion of the inner surface comprises:

a. a top region adjacent the inner surface adjacent the top surface, said top region defining a loop having a plane which is parallel to the top surface; and b. a bottom region adjacent the inner surface adjacent the bottom surface, said bottom region defining a loop having a plane which is parallel to the bottom surface.

7. An apparatus according to claim 2 wherein the shielding layer is electrically connected to a ground potential to provide a low impedance path to couple the electromagnetic energy to said ground potential.

8. An apparatus according to claim 2 wherein the shielding layer is formed of a ferrite.

9. An apparatus according to claim 2 wherein the shielding layer is formed of a high resistivity metal.

10. An apparatus according to claim 2 wherein the shielding layer is formed of a ferroelectric material.

11. An apparatus according to claim 2 wherein the shielding layer is formed of a composite ferroelectric and ferromagnetic compound.

12. An apparatus according to claim 2 wherein the dielectric means is a thin film insulating layer which confirms to an outer surface of the shielding layer.

13. An apparatus according to claim 1 wherein the dielectric means is an insulating layer conforming to the midregion of the contact between the top end and the bottom end and the shielding means is a shielding layer which conforms to a surface of said insulating layer, said insulating layer electrically insulating the midregion of the contact from said shielding layer.

14. An apparatus according to claim 13 wherein the shielding layer is formed of a ferrite.

15. An apparatus according to claim 13 wherein the shielding layer is formed of a high resistivity metal.

16. An apparatus according to claim 13 wherein the shielding layer is formed of a ferroelectric material.

17. An apparatus according to claim 13 wherein the shielding layer is formed of a composite ferroelectric and ferromagnetic compound.

18. An apparatus according to claim 13 wherein the shielding layer is electrically connected to a ground potential to provide a low impedance path to couple the electromagnetic energy to said ground potential.

19. An apparatus according to claim 1 wherein the number of slots and the number of contacts is one.

20. An apparatus according to claim 1 wherein the number of slots and the number of contacts is greater than one.

21. Apparatus for electrically interconnecting a number of device terminals to a number of board terminals, comprising:

a. a housing having a top surface and a bottom surface and a number of contact receiving slots extending between said top surface and said bottom surface, each one of said number of slots extending substantially parallel to a corresponding axis extending between a corresponding one of the number of device terminals and a corresponding one of the number of board terminals, each of said device terminals being spaced at a distance from a corresponding one of the number of board terminals;

b. a number of contacts, each one of said number of contacts received within a corresponding one of said number of slots to electrically connect a corresponding one of the number of device terminals to a corresponding one of the number of board terminals, each of said number of contacts having a top end extending outward from said top surface to conductively engage said corresponding device terminal, a bottom end extending outward from said bottom surface to conductively engage said corresponding board terminal, and a midregion between said top end and said bottom end, said housing absorbing electromagnetic energy generated by said number of contacts when each of said number of contacts is conductively engaging both its corresponding device terminal and its corresponding board terminal, wherein said housing dissipates the absorbed electromagnetic energy as thermal energy; and c. a dielectric layer to electrically insulate each of said number of contacts from said housing, said dielectric layer conforming to an inner surface of each said one of said number of slots.

22. An apparatus according to claim 21 wherein the housing is formed of a ferrite.

23. An apparatus according to claim 21 wherein the housing is formed of a ferroelectric material.

24. An apparatus according to claim 21 wherein the housing is formed of a composite ferroelectric and ferromagnetic compound.

25. An apparatus according to claim 21 wherein the housing is electrically connected to a ground potential to provide a low impedance path to couple the electromagnetic energy to said ground potential.

* * * * *